(12) United States Patent
Song et al.

(10) Patent No.: US 7,729,177 B2
(45) Date of Patent: Jun. 1, 2010

(54) PAGE BUFFER FOR NONVOLATILE MEMORY DEVICE

(76) Inventors: Dae Sik Song, Daewoo Apt, Sangha-ri, Young-si, 103-1304 Gyeonggi-dong (KR); Jaeseok Park, #202, Sunjin villa, 242-136, Guui 1-dong, Gwangjin-gu, Seoul 143-201 (KR); Jacopo Mulatti, Via C. Percoto, 29, 33053 Latisana (IT)

( * ) Notice: Subject to any disclaimer, the term of this patent is extended or adjusted under 35 U.S.C. 154(b) by 252 days.

(21) Appl. No.: 11/759,649

(22) Filed: Jun. 7, 2007

(65) Prior Publication Data

US 2007/0297228 A1    Dec. 27, 2007

(30) Foreign Application Priority Data

Jun. 7, 2006    (EP) .................................. 06115106
Jun. 22, 2006   (EP) .................................. 06115912

(51) Int. Cl.
  G11C 16/06    (2006.01)
  G11C 16/10    (2006.01)
  G11C 16/26    (2006.01)
  G11C 7/10     (2006.01)
  G11C 7/06     (2006.01)

(52) U.S. Cl. ............................ 365/189.05; 365/185.17; 365/185.08

(58) Field of Classification Search ............ 365/189.05, 365/185.17, 185.08
See application file for complete search history.

(56) References Cited

U.S. PATENT DOCUMENTS

| | | | |
|---|---|---|---|
| 6,091,637 A | 7/2000 | Hakozaki | 365/185.22 |
| 6,266,270 B1* | 7/2001 | Nobukata | 365/185.03 |
| 6,888,758 B1* | 5/2005 | Hemink et al. | 365/185.22 |
| 6,937,510 B2* | 8/2005 | Hosono et al. | 365/185.03 |
| 7,061,813 B2* | 6/2006 | Lee | 365/189.05 |
| 7,242,620 B2* | 7/2007 | Nagashima | 365/185.21 |
| 2003/0117856 A1 | 6/2003 | Lee et al. | 365/189.05 |
| 2005/0018488 A1 | 1/2005 | Kim et al. | 365/185.28 |
| 2006/0050314 A1* | 3/2006 | Shiga et al. | 358/1.16 |

FOREIGN PATENT DOCUMENTS

EP    1249842    10/2002

* cited by examiner

*Primary Examiner*—J. H. Hur
(74) *Attorney, Agent, or Firm*—Schwabe, Williamson & Wyatt, P.C.

(57) ABSTRACT

A nonvolatile memory device implements a program routine followed by a program-verify routine when recording or modifying stored data. The nonvolatile memory device may include an array of memory cells for storing data, a sense node, and a gating circuit for selectively connecting a bitline of the array of memory cells to the sense node. The nonvolatile memory device may also include a page buffer coupled to the sense node. The page buffer may include a main latch for storing data to be written in the nonvolatile memory device, a cache latch for storing data supplied on an input line of the nonvolatile memory device to be transferred in the main latch through a source liner and a temporary static latch connected to the main latch through the source line and to the cache latch through an auxiliary switch and for transferring data between the main latch and the cache latch. The cache latch may be isolated from the source line during execution of the program routine and of the program-verify routine.

18 Claims, 21 Drawing Sheets

SELECTED 1-2-3 OR 1'-2'-3' PATH ACCORDING TO PAGE-ADDRESS

PAGE BUFFER FOR NONVOLATILE MEMORY DEVICE

FIELD OF THE INVENTION

This invention relates in general to memory devices, and, in particular, to a page buffer of a FLASH memory.

BACKGROUND OF THE INVENTION

Non-volatile memory devices include a circuit, called a "page buffer", dedicated to handle data information to be programmed into the memory and to be read from the memory. This circuit may also play a key role when memory array cells are erased. If nonvolatile memory information is accessed per page, there is a page buffer for each cell of the page.

The architecture of a page buffer according to the prior art is depicted in FIG. 1. The arrows illustrate the path of a signal representative of a bit read from a memory cell. In a read operation, a page buffer performs the following operations: a) it senses the program or erased state of the memory cell; b) at the end of the sensing operation, its output provides digital information which reflects the state of the read cell (for example, it is "1", if the read cell is erased or it is "0" if the read cell is programmed); c) the state of the cell being read is stored into a latch within the page buffer (MAIN LATCH), so it can be retrieved later and read after the read algorithm is completed.

The page buffer is first reset (phase 1) by activating MRST; then a cell state is read through the source line SO (phase 2), and it is stored in the "main latch" when a signal MLCH is pulsed. Then (phase 3), the bit stored in the main latch (the voltage on the node QB_d) can be transferred to the IO buffers of the nonvolatile memory.

In a program operation, the page buffer executes the following three steps: 1) pattern storage; 2) pattern transfer; and 3) program pattern. After the program operation has been carried out, the program-verify operation may be executed. FIG. 2 illustrates the pattern storage operation in a known page buffer. Digital information that is to be programmed may be stored in the so called "cache latch".

First, the cache latch is set to "1" (phase 1) by an activating signal CSET. If the data to be programmed is "0", the cache latch is flipped (that is the logic content thereof is reversed) by asserting the signal nDI (phase 2); otherwise if the bit to be programmed is "1", the signal nDI is not asserted and the cache latch is not flipped. In practice, asserting the signal nDI means that a "0" is to be programmed in the memory cell.

FIG. 3 illustrates the pattern transfer operation in the same known page buffer. The objective of this operation is to transfer the bit stored in the cache latch to the main latch. First the main latch is reset (phase 3) by pulsing the MRST signal; subsequently, information from cache latch is transferred to the SO node (phase 4) by activating a PDUMP signal, and it is stored in the main latch by pulsing MLCH. At the end of this phase, the node QB_d (that is the bit stored in the main latch) is set to "1" if the memory cell is not to be programmed (that is a "1" is to be written in the cell of the memory array), or it is set to "0" if the memory cell is to be programmed.

As soon as the bit to be written has been transferred to the main latch, the information stored in the cache latch is no longer relevant for the program operation; thus, a new bit to be programmed in a cell of a different page can be stored into the cache latch, thereby allowing the nonvolatile memory to "cache" two subsequent program operations.

As well known to a person of ordinary skill in the art, "caching" data insertion in the page buffer greatly improves program throughput of the nonvolatile memory because insertion of a bit to be written in a cell of page (i+1) is performed while carrying out the program algorithm for page (i). FIG. 4 illustrates the program pattern operation in the same known page buffer. The program pattern operation is triggered (phase 1) when the signal PGM is asserted, in detail, when the bit "1" is to be programmed, the cell bitline is forced to "1" (program inhibit). While when the bit "0" is programmed, the cell bitline is grounded.

FIG. 5 sketches a bitline of a FLASH NAND memory device and the respective page buffer. After the above discussed three steps have been carried out, the program-verify operation that follows checks whether the bit has been correctly written in the memory cell or not. In case of a FAIL, the previous three program steps are repeated at an increased voltage bias of the wordline WL. When verifying the cell, if the selected cell is programmed, which means the cell stores a "0", then the cell is off, the voltage BLe remains high, and the voltage QB goes to 1 with a MLCH pulse. This makes the signal nWDO float.

On the other hand, if a "1" is to be programmed on the selected cell, QB is set to 1. When verifying the cell, if the selected cell is erased, i.e. the cell stores a "1", then the cell is on, the voltage BLe switches low, and the cell may not affect the latched voltage QB. Thus, the level of the voltage QB corresponds to a "1". This also makes the signal nWDO float.

The nWDO signals of the page buffers (PB) of the memory device may be merged according to a logic OR into a single nWDO signal, as shown in FIG. 6. The command CHECK is generated for enabling the generation of the flag PASS. The signals WDO are inverted replicas of the corresponding signals nWDO.

If all the selected cells are programmed successfully, all nWDO signals are floating. When the command CHECK switches high, then the flag PASS is high, and the program operation has been concluded successfully. Otherwise, if a bit "0" was to have been written in the cell but the selected cell is found to be erased, that is the cell that is not yet programmed (i.e. the cell is still conducting), and the voltage BLe switches low. This may not affect the value of the latched bit QB with the MLCH pulse, that is the bit QB remains at a level corresponding to "0", thus the signal nWDO is high.

There is at least one nWDO signal that is at a high logic level, and the flag PASS is low; therefore, the failed program operation is flagged. In practice, during the program-verify operation, all the nWDO signals are checked simultaneously for generation of the PASS flag. The flow chart of FIG. 7 resumes the program-verify operation, and the flow chart of FIG. 8 continues the above four steps of the whole program operation.

Page buffers may also play a key role during other two operations that may not be allowed in nonvolatile memory devices, notably the "copy back program" operation and the "erase" operation, but this may not be relevant in this context and will not be considered. According to known techniques, the main latch may not reset before each program-verify operation. Indeed, the MRST signal may not be pulsed before each program-verify. This implies that, if during a program-verify operation, a page buffer latch is unexpectedly flipped, then the related cell may not receive further program pulses even if the relative cell has not reached the desired turn-on threshold. This situation is often referred in literature as "permanent inhibit" and may occur in the same way as when sensing a programmed cell (QB_d node is set to 1), for example, because of noise peaks or voltage surges on the source line SO.

U.S. patent application publication No. 2003/0117856 to Lee et al. discloses a nonvolatile memory device that has a page buffer including two banks of latches. This arrangement may cause a program fail if noise occurs on the common source line. Due to permanent inhibit, a cell where the threshold voltage has not yet reached a desired level (insufficiently programmed) could be erroneously recognized as a correctly programmed cell during a program-verify operation if disturbances are present during the execution of this step. This may cause the exclusion of the cell from receiving further program pulses used to reach the desired threshold voltage.

For this reason, Lee et al. discloses refreshing the bit stored in the main latch before each program-verify operation. In practice, the bit stored in the cache latch is copied in the main latch, then the program-verify operation is carried out for verifying whether the cell has been correctly programmed or not.

On the other hand, in order to retain the so-called "cache program" functionality, that is for loading in the cache latch a bit to be written in a cell of another page while the bit in the main latch is being written in the current page, the architecture of the page buffer may become more complicated. The "target pattern" to be programmed in page (i) should be stored in a register different from the cache latch, in order to make the latter available for storing the pattern of page (i+1).

FIG. 9 shows the two-register memory device of Lee et al., which includes a so-called "storing circuit" for providing an approach to the problems discussed above and for retaining the "caching" function. FIG. 10 is a simplified flow chart that describes the interaction among the three parts of the page buffer of Lee et al. The three parts are the "sense amplifier 2" (that corresponds to the "main latch" in our terminology), the "sense amplifier 1" (that corresponds to the "cache latch"), and the storing circuit. A weakness of the architecture disclosed by Lee et al. may be the fundamental issue of realizing a page buffer substantially insensitive to noise is still not achieved.

Tests carried out by the Applicants showed that it is still possible, though less probable than in the known page buffer of FIG. 1, that the bit stored in the cache latch of the page buffer of Lee et al. may be flipped by noise or eventual voltage surges on the source line.

SUMMARY OF THE INVENTION

An approach to the above problems is provided by a memory device having architecture, and a page buffer where noise or eventual voltage surges on the source line may not cause failure of program operations. This makes possible the reliable storing of a bit to be written in a cell of a page of the memory device while a program operation is in progress on a different page.

This page buffer attains this advantageous result because the cache latch is isolated from the source line during program operations and during program-verify operations. Moreover, the main latch and the cache latch are not directly connected, but are coupled through a temporary latch that is used for transferring data from the cache latch to the main latch.

In known page buffers, eventual noise or voltage surges present on the source line of a selected bitline may flip the bit stored in the cache latch because this latch is directly connected to the source line during program operations or before program-verify operations. Eventually, this may inhibit the application of further program pulses to a cell not yet correctly programmed.

In this page buffer, this undue condition may not happen because the cache latch is not connected to the source line during a program or program-verify operations, but the bit stored therein is transferred to the source line through a temporary latch. Therefore, when the bit stored in the main latch is refreshed before executing the program-verify operation, i.e. that is when the bit stored in the cache latch is re-loaded in the main latch, the bit in the cache latch may not be corrupted because noise and voltage surges on the source line are unable to flip the bit stored therein.

DETAILED DESCRIPTION OF THE PREFERRED EMBODIMENTS

Figure 11:
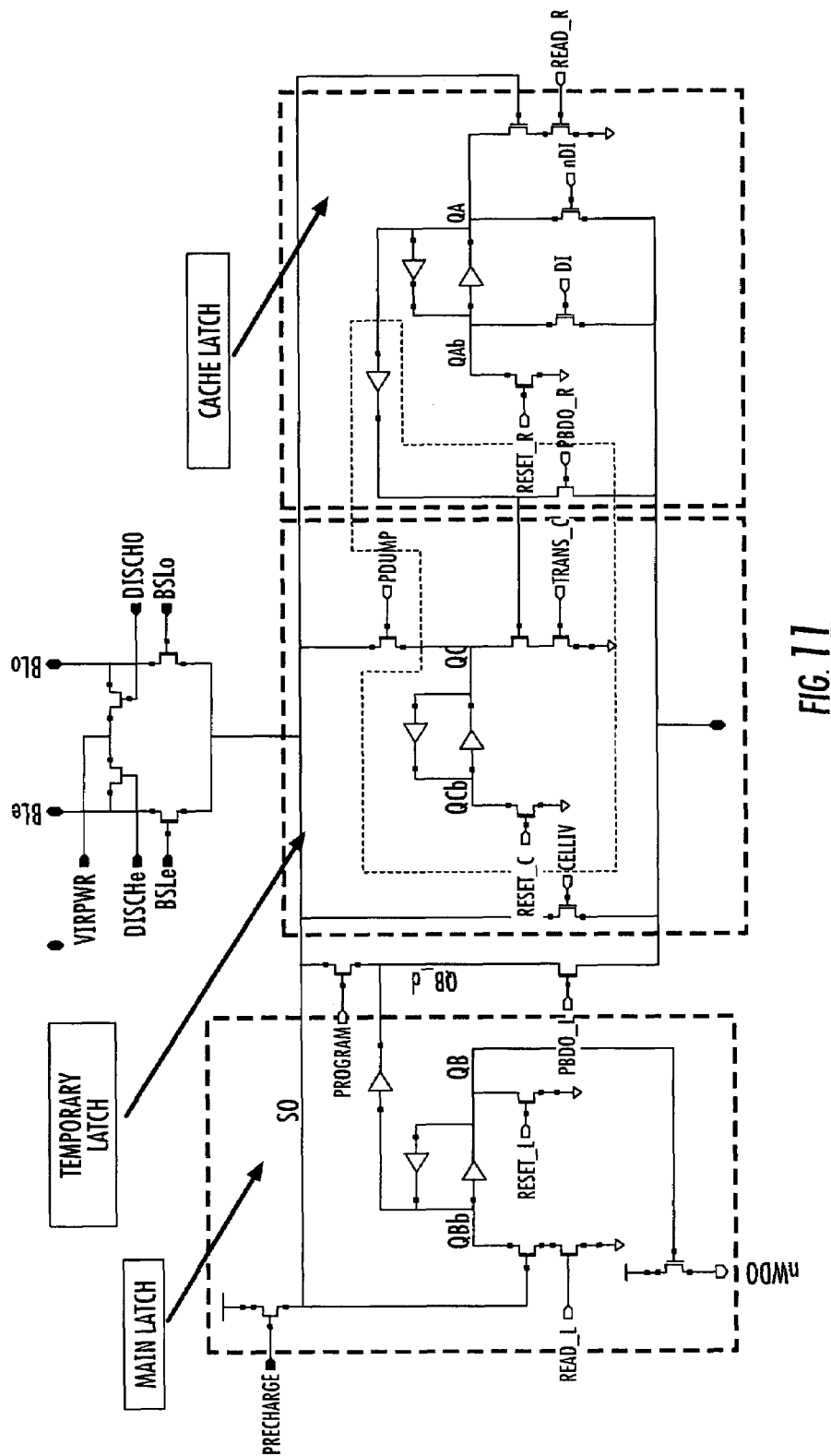
FIG. 11 depicts the page buffer that includes a temporary latch and in which the cache latch is isolated from the source line SO during program operations according to the invention.

An embodiment of a page buffer is depicted in FIG. 11 and comprises three blocks 1) the main latch; 2) the cache latch; 3) the temporary latch. Each of these blocks comprises a static latch. This may ensure greater noise immunity than the known page buffer of FIG. 1 during program algorithms, while retaining the above discussed "cache program" function. According to the approach of U.S. patent application publication No. 2003/0117856 to Lee et al., the so called "storing circuit" disclosed therein is a dynamic latch that relies on the parasitic capacitance of N_DATA to maintain the bit pattern to be stored in page (i) before refreshing the bit stored in the main latch.

Figure 1:
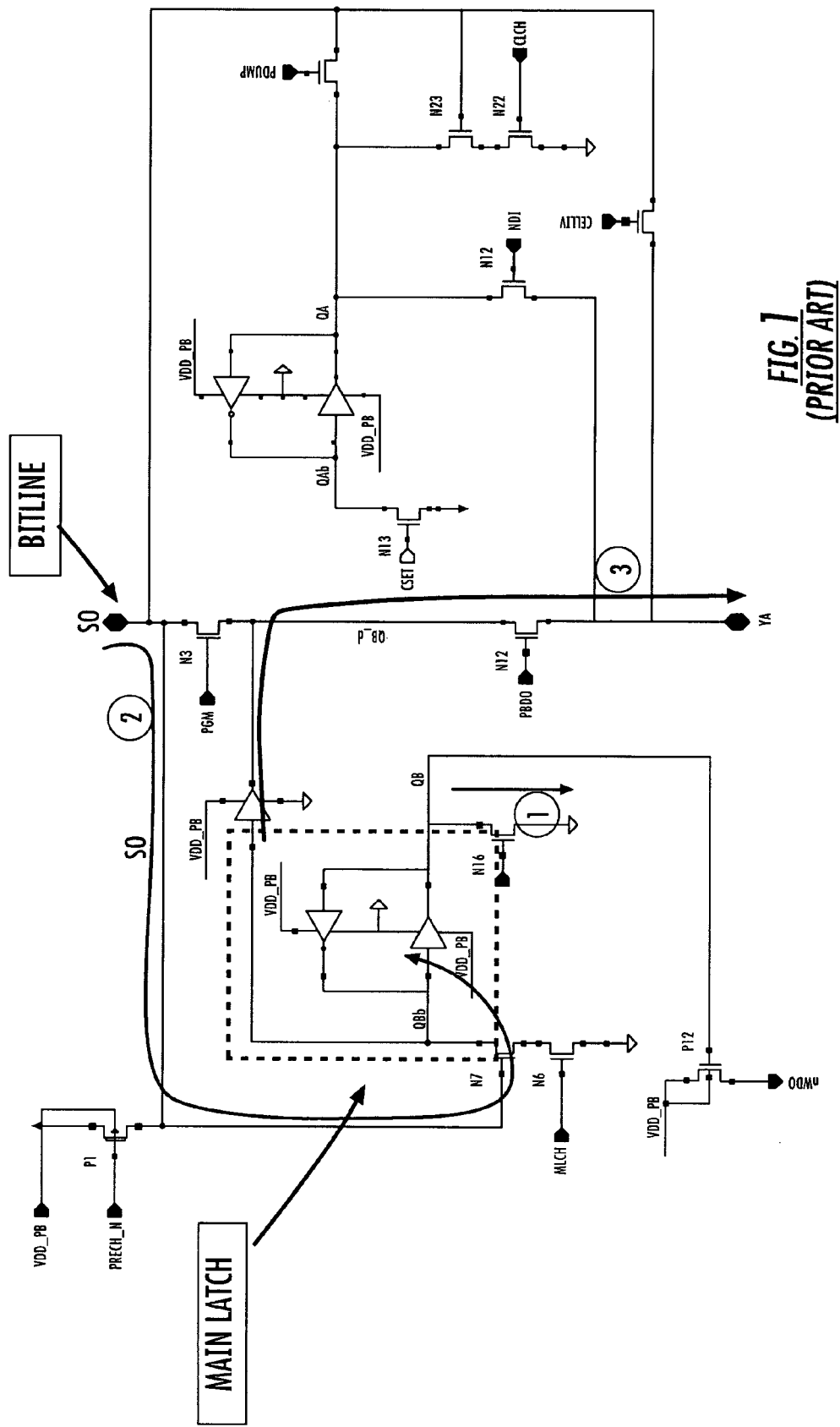
FIG. 1 illustrates a page buffer and the path of a bit read from the memory cell array according to the prior art.
Figure 2:
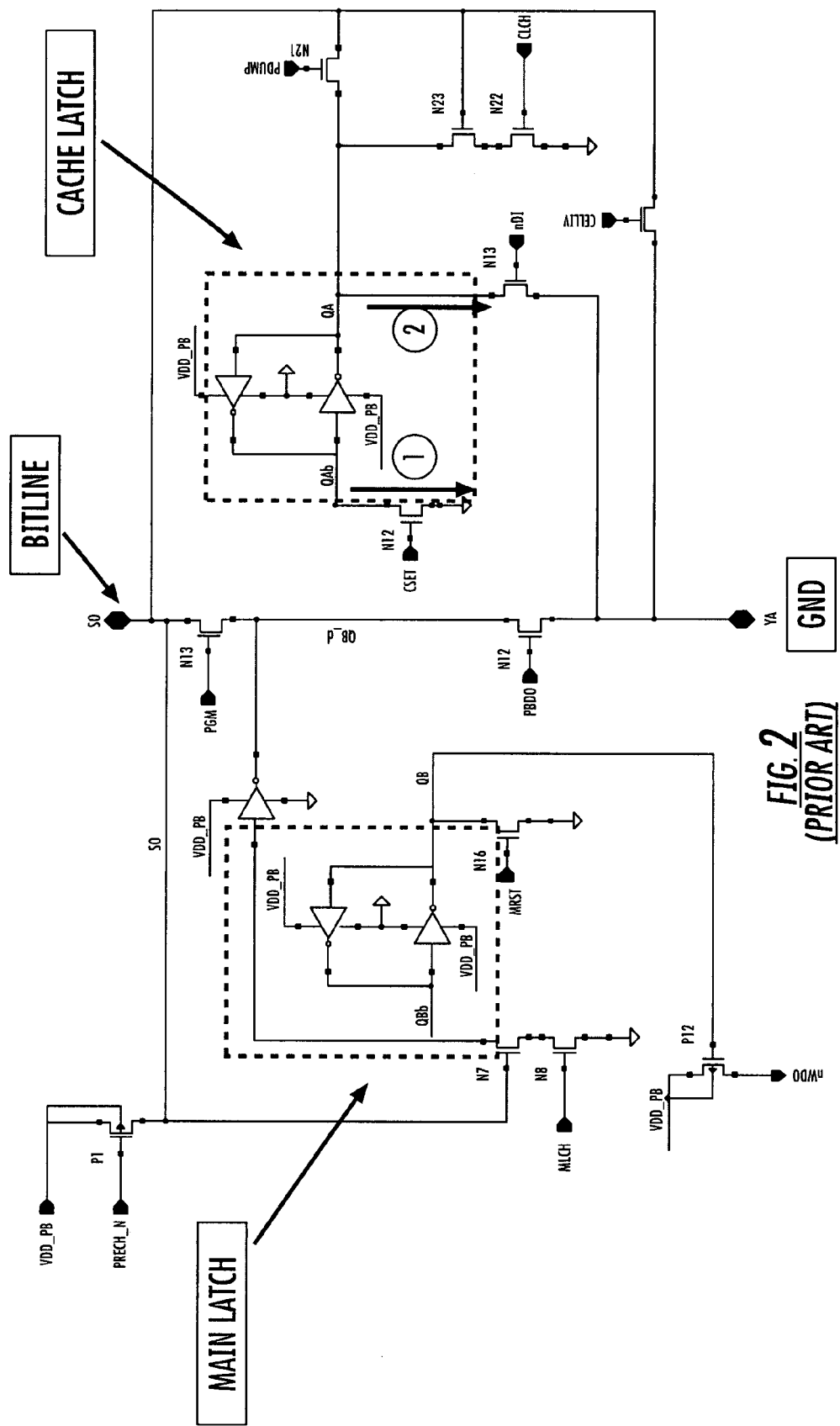
FIG. 2 illustrates the path of a bit to be written in a memory cell during the "pattern storage" step of a program operation in the page buffer according to the prior art.
Figure 3:
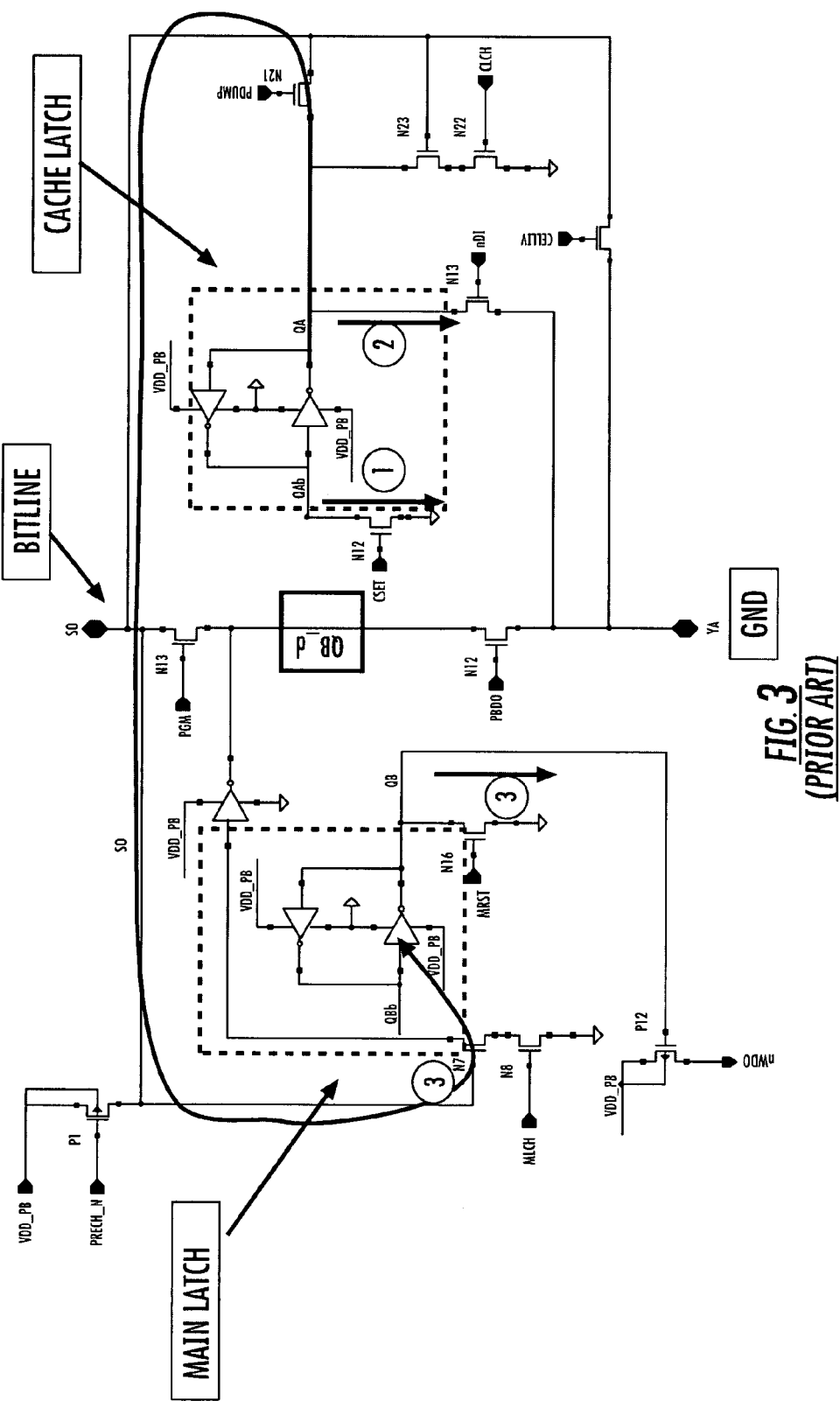
FIG. 3 illustrates the path of a bit to be written in a memory cell during the "pattern transfer" step of a program operation in the page buffer according to the prior art.
Figure 4:
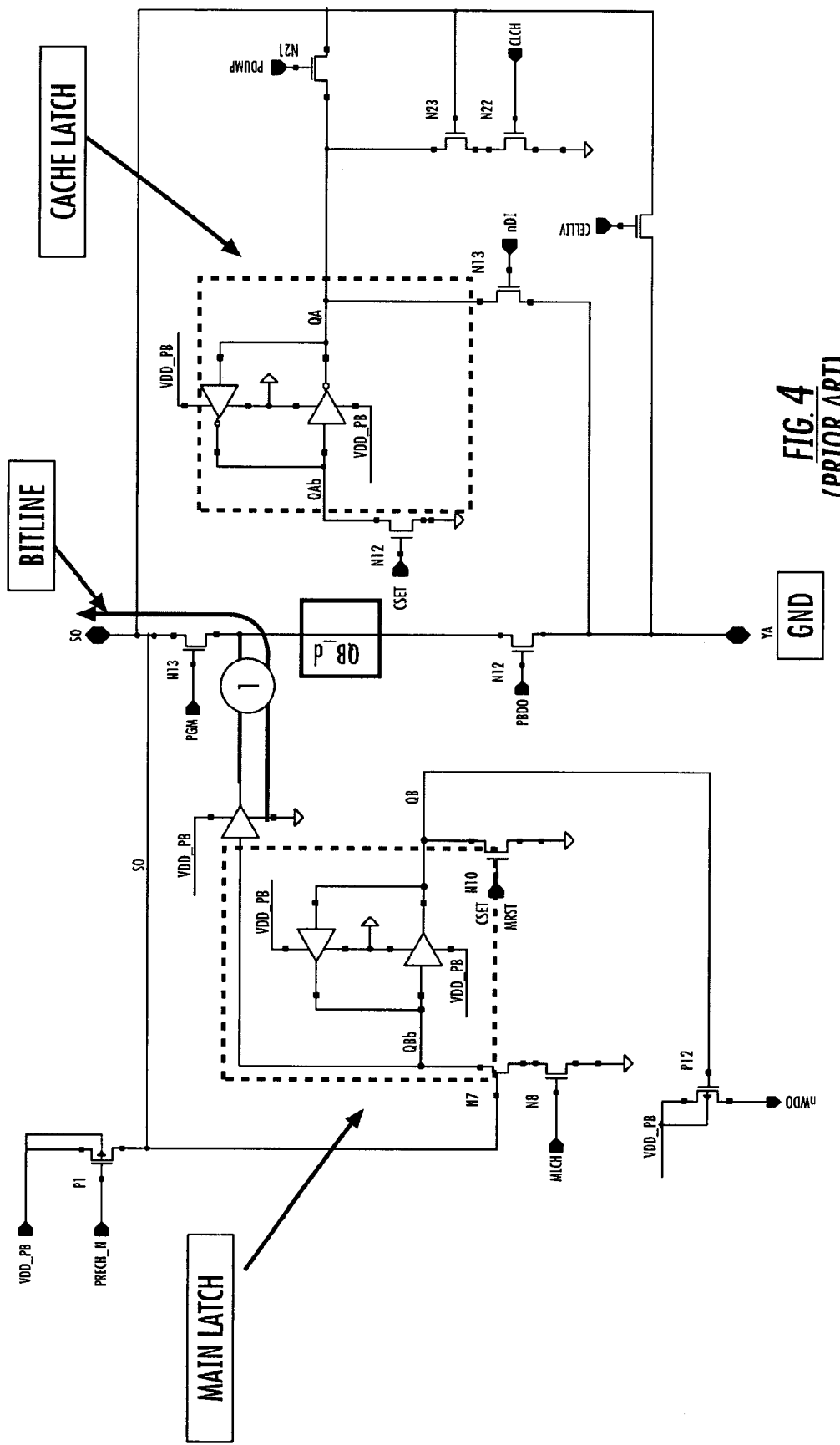
FIG. 4 illustrates the path of a bit to be written in a memory cell during the "program pattern" step of a program operation in the page buffer according to the prior art.
Figure 5:
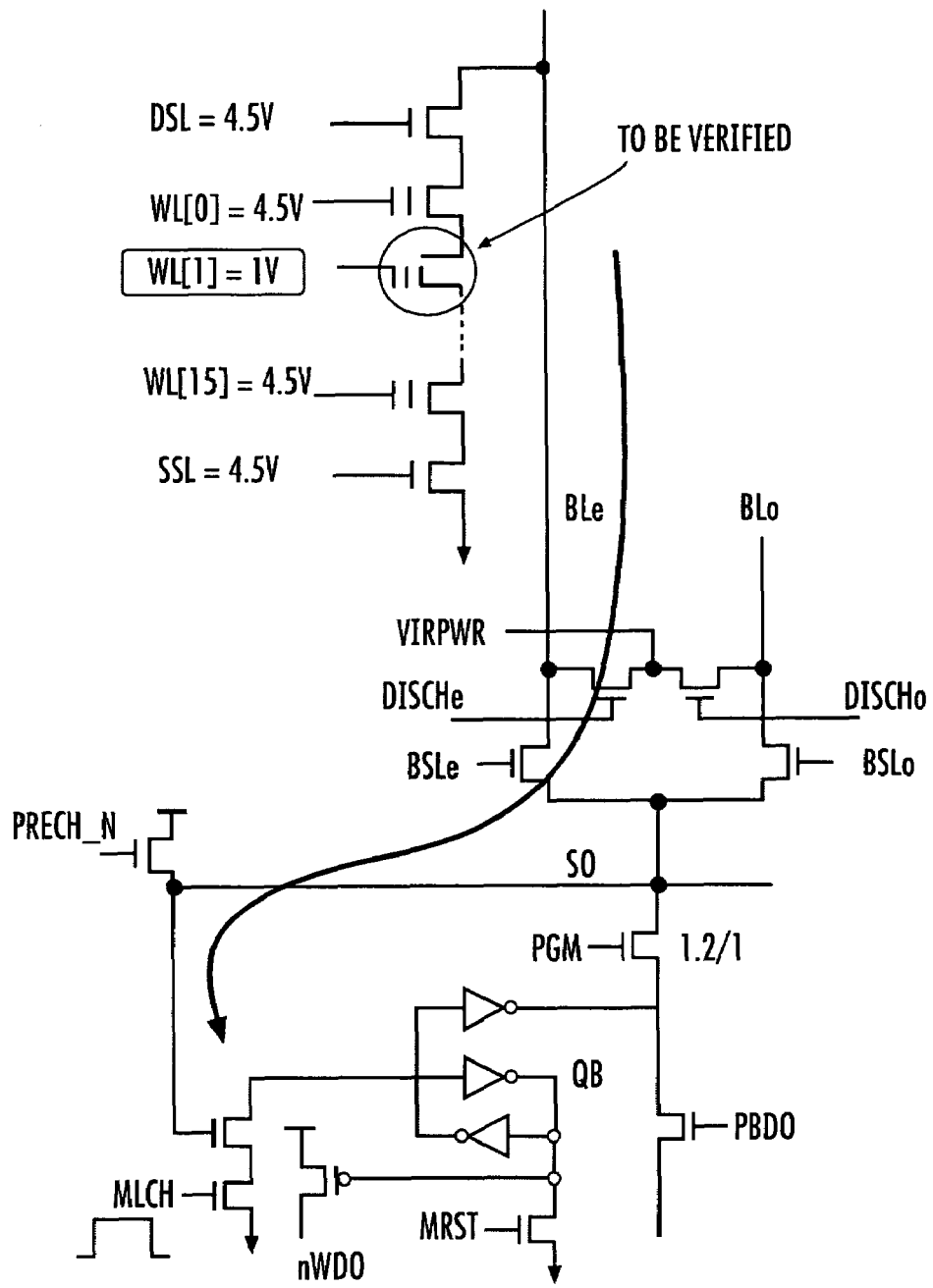
FIG. 5 illustrates the "program-verify" operation of a program operation in the page buffer according to the prior art.
Figure 6:
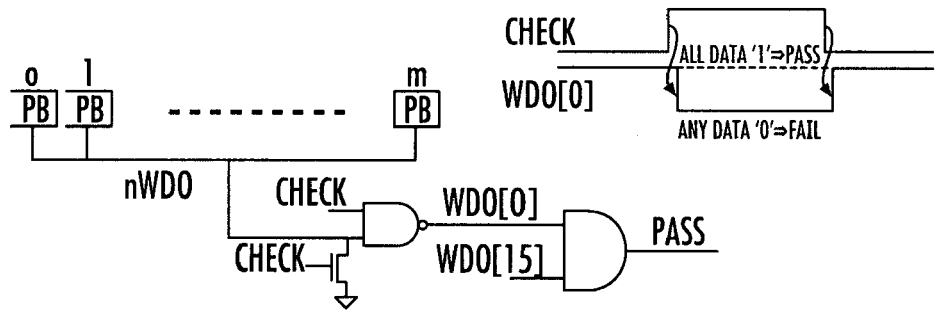
FIG. 6 illustrates how the nWDO signals are combined for generating the PASS flag in the page buffer according to the prior art.
Figure 7:
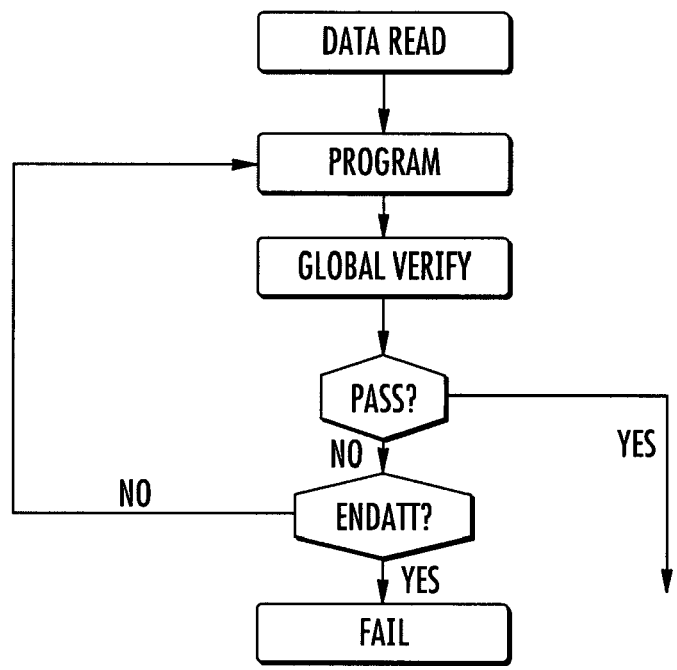
FIG. 7 is a flow chart that illustrates the steps of a program-verify operation in the page buffer according to the prior art.
Figure 8:
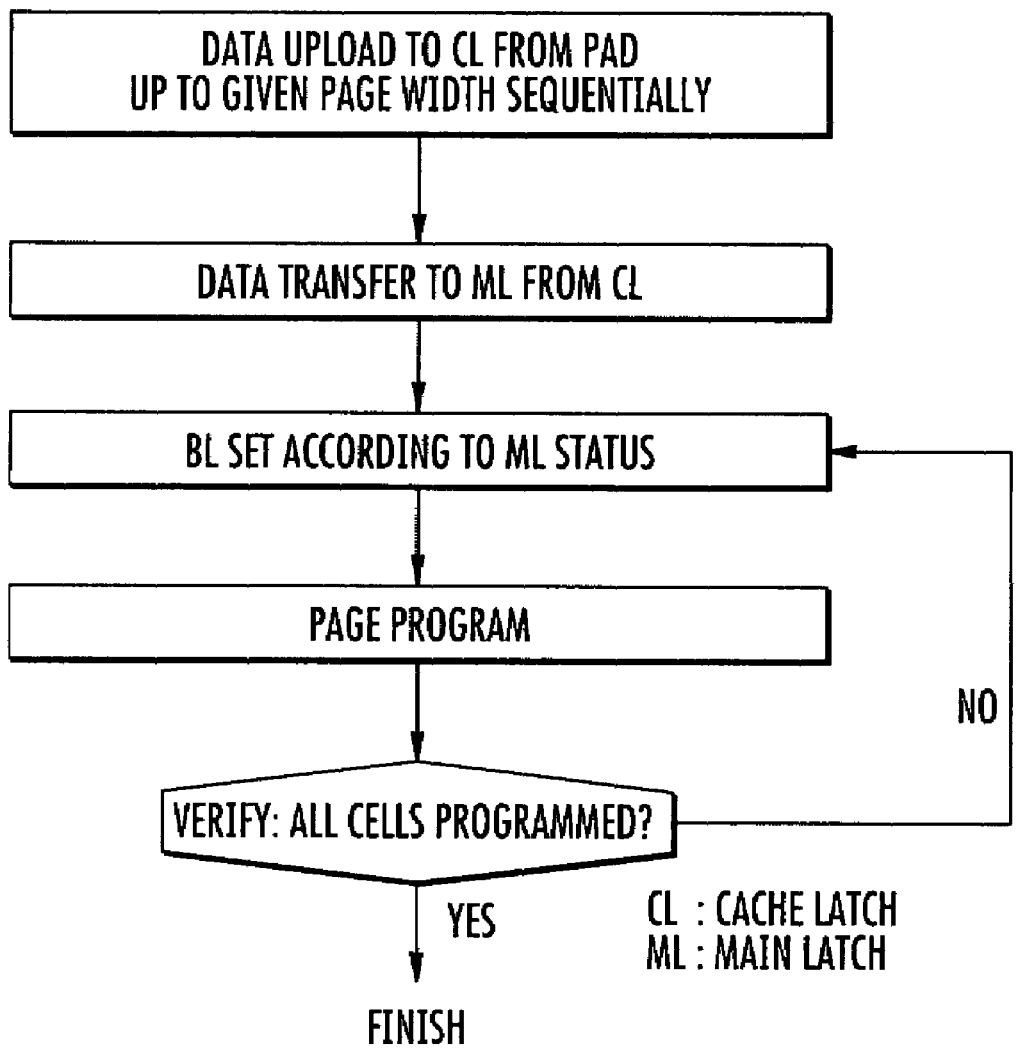
FIG. 8 is a flow chart that illustrates the steps carried out for programming and verifying a bit written in a memory cell in the page buffer according to the prior art.
Figure 9:
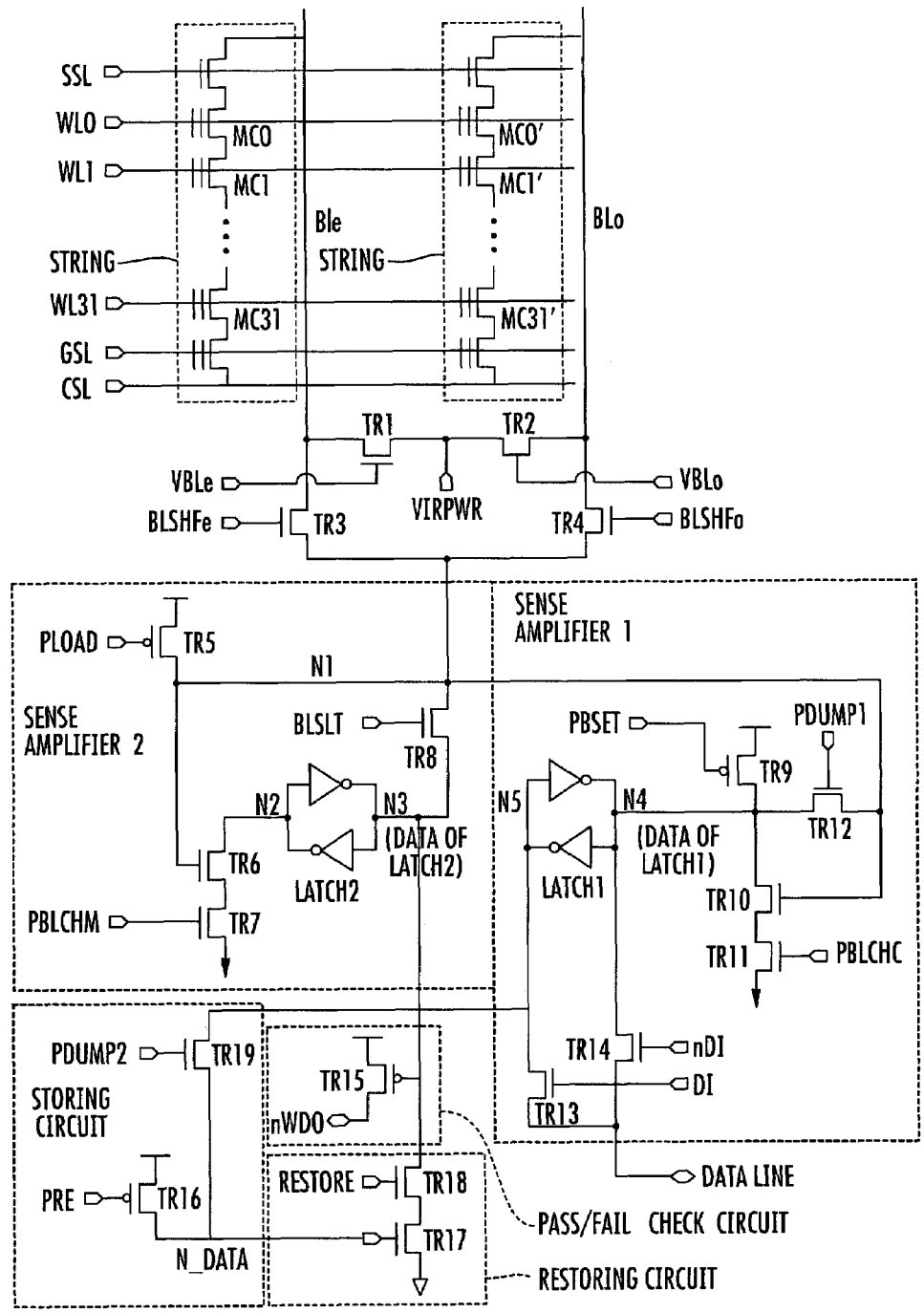
FIG. 9 depicts the two-register memory device according to U.S. patent application publication No. 2003/0117856 to Lee et al.
Figure 10:
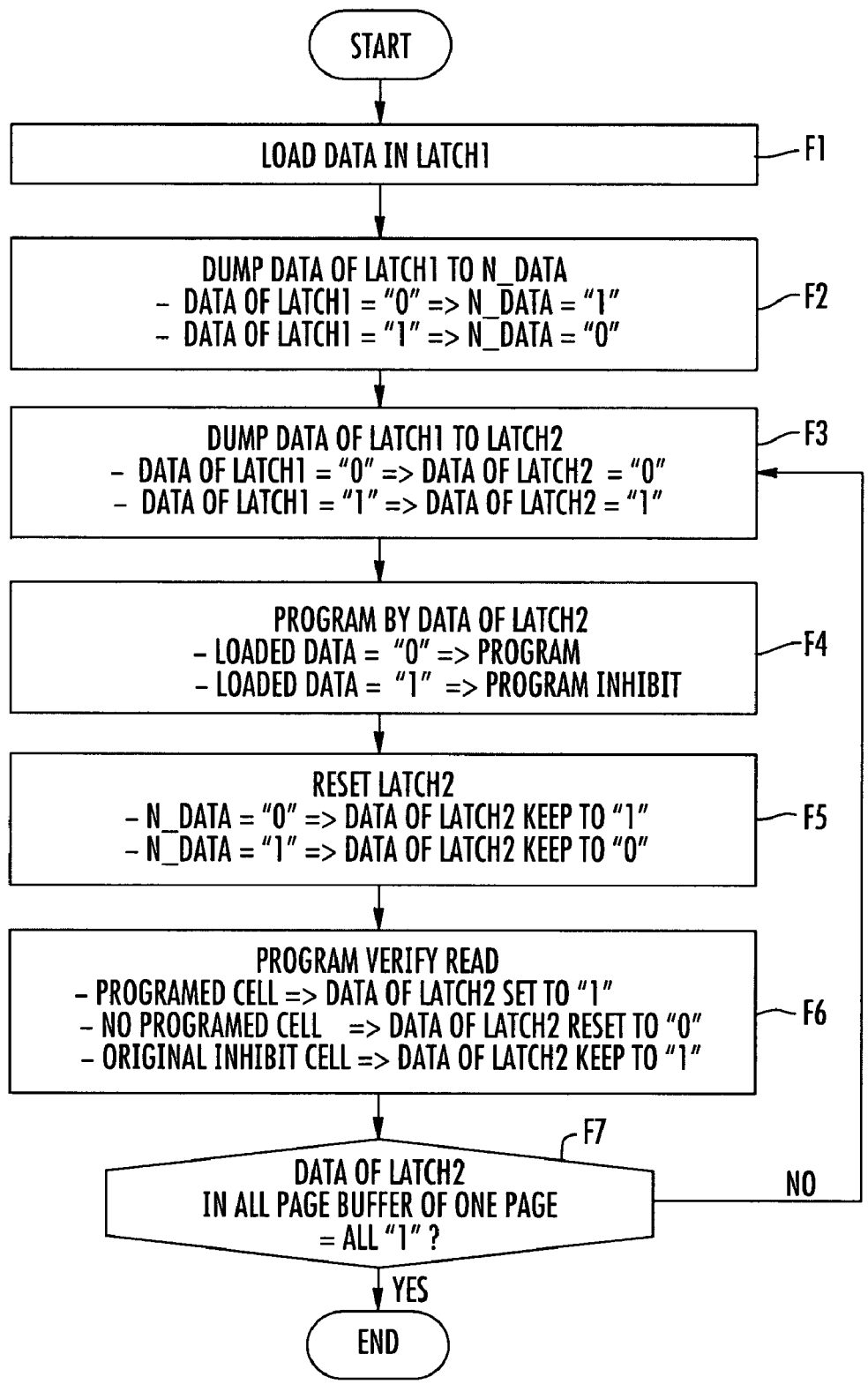
FIG. 10 is a simplified flow chart that describes the interaction among the three parts of the page buffer disclosed in U.S. patent application publication No. 2003/0117856 to Lee et al.
Figure 12:
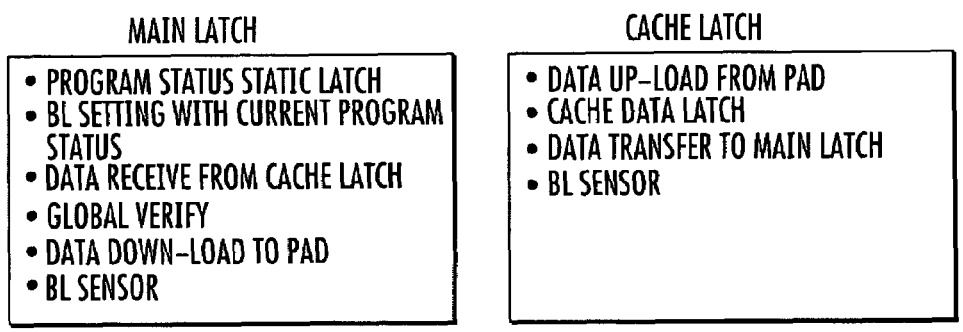
FIG. 12 illustrates schematically the functions executed by the main latch and the cache latch of the page buffer of FIG. 1.
Figure 13:
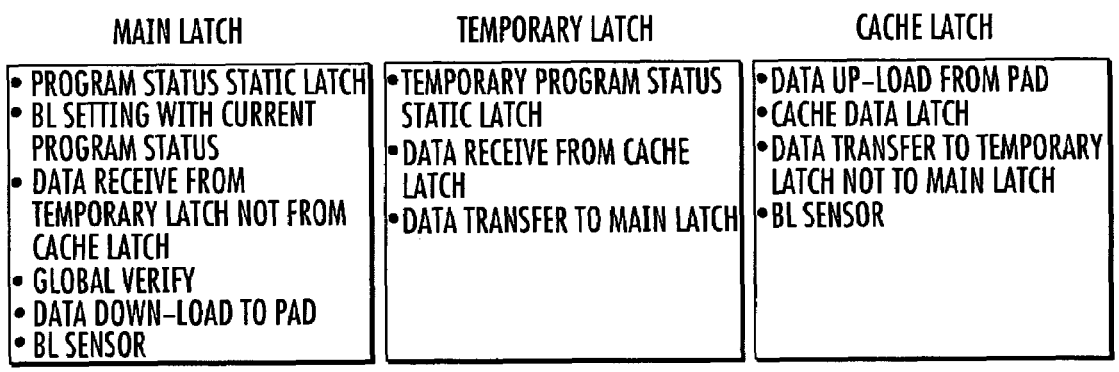
FIG. 13 illustrates the functions carried out by the page buffer according to the invention.
Figure 14:
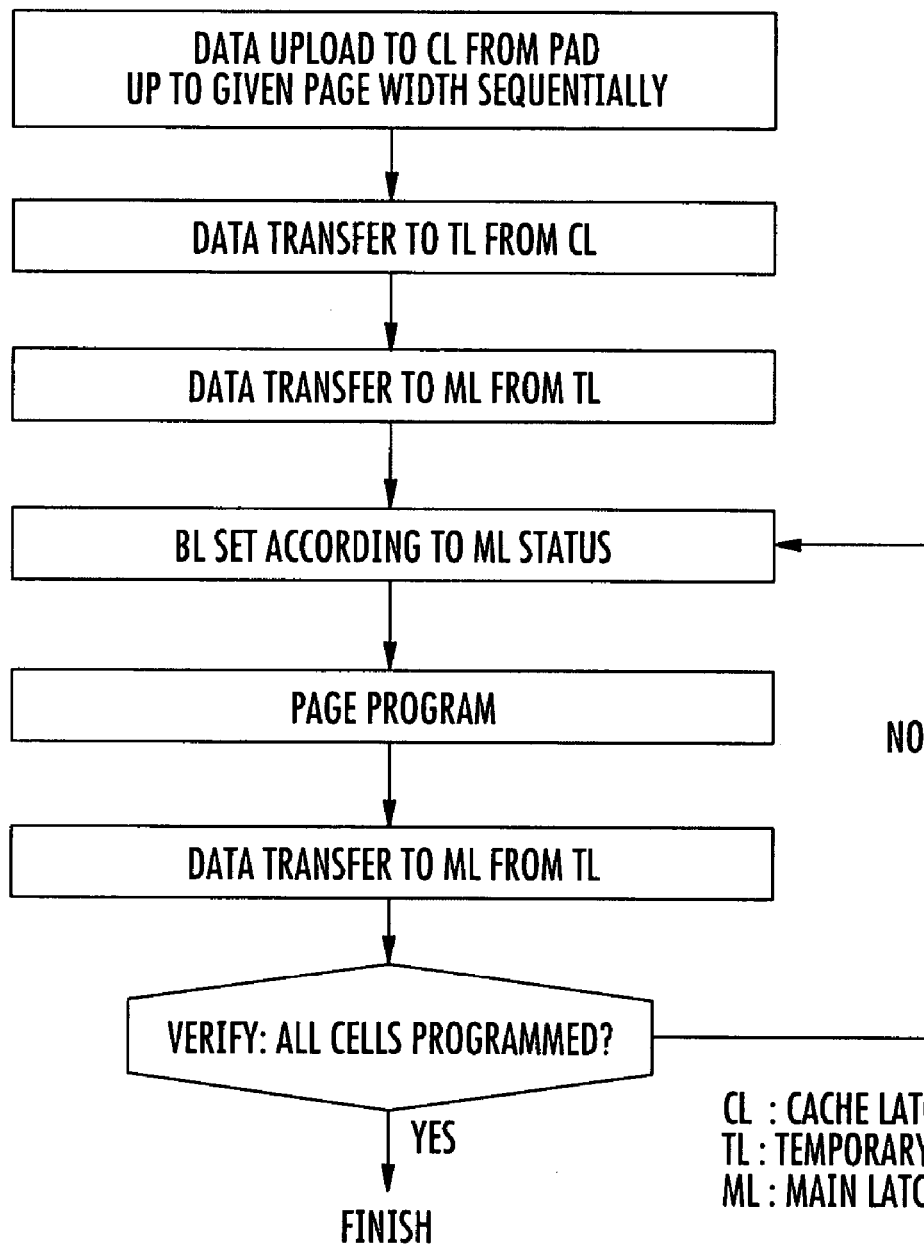
FIG. 14 is a flow chart that illustrates the succession of steps carried out by the page buffer according to the invention.

For ease of comparison, FIG. 12 illustrates the functions that are executed by the main latch and by the cache latch of the known page buffer of FIG. 1, while FIG. 13 illustrates the functions that are carried out by the page buffer of this embodiment. The succession of steps carried out by this page buffer is explained in the flow chart of FIG. 14. In practice, data is transferred from the cache latch to the main latch through the temporary latch.

Figure 15:
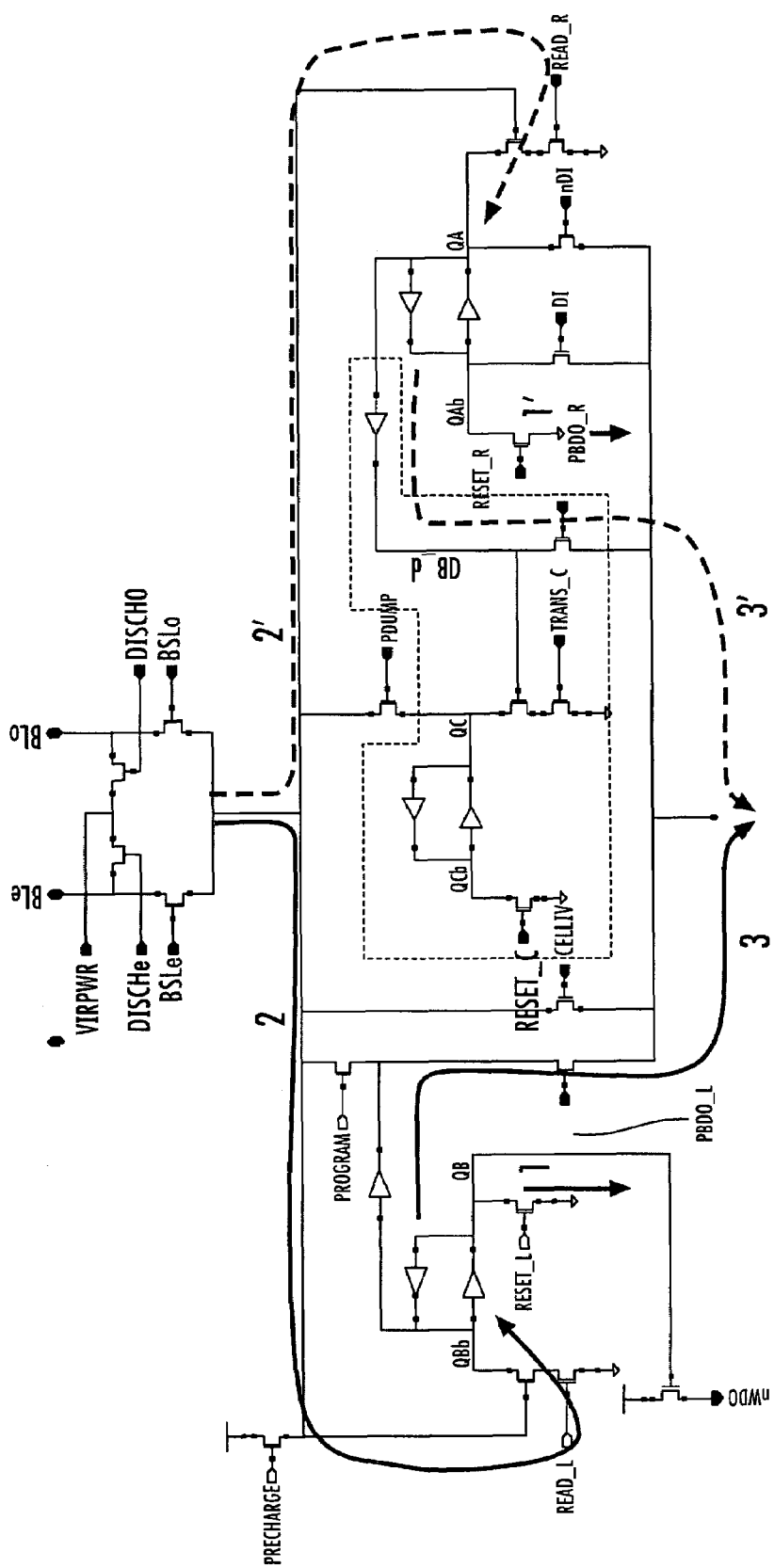
FIG. 15 depicts the page buffer and the arrows illustrate the paths of a bit read from a memory cell according to the invention.

FIG. 15 depicts the page buffer, and the arrows illustrate the two alternative paths of a signal representative of a bit read from a memory cell. The sequence of steps for carrying out a read operation is the same as explained with reference to FIG. 1. It should be noted that a read operation may be carried out also through the temporary latch (phases 1', 2' and 3').

Figure 16:
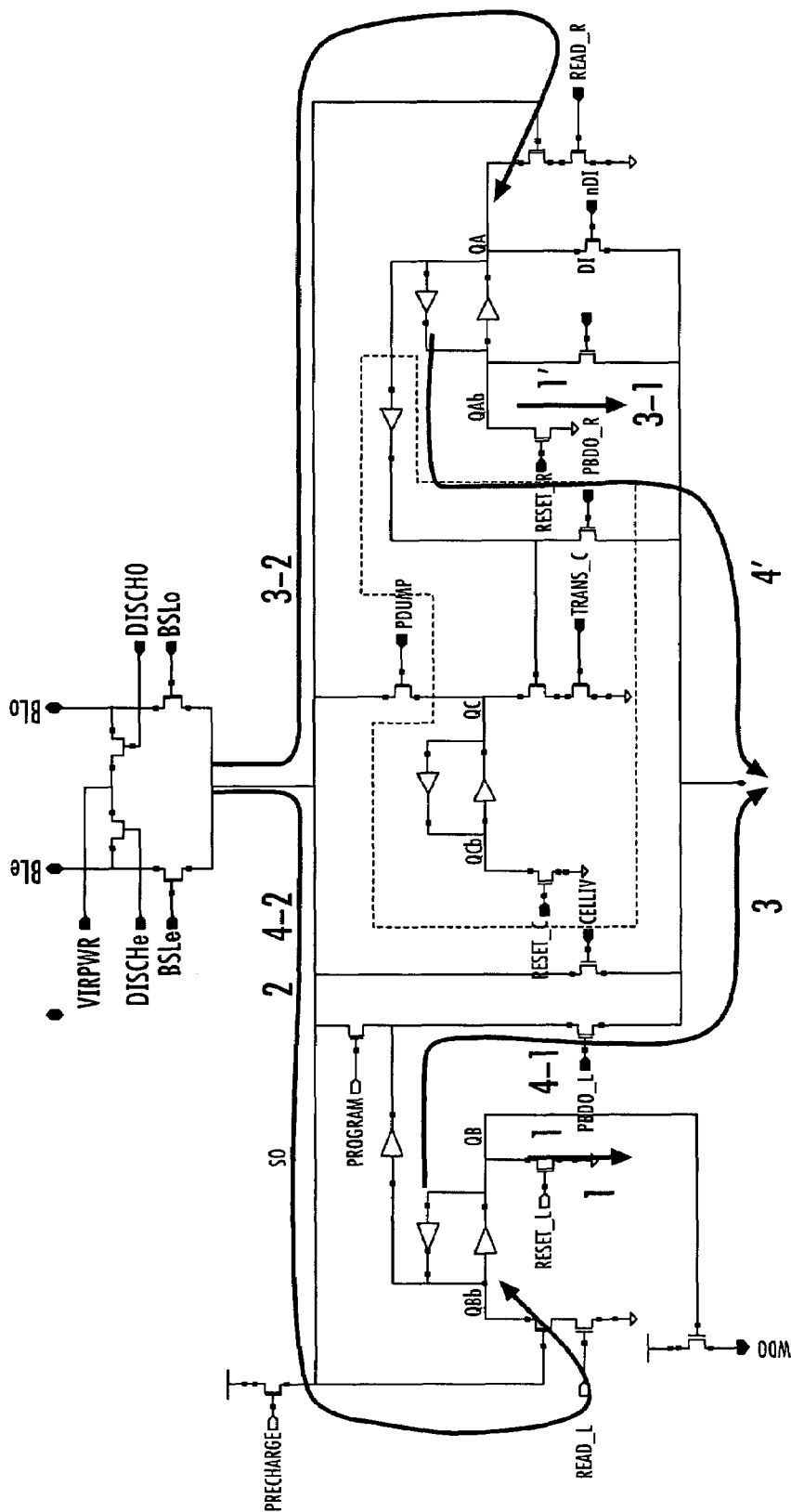
FIG. 16 depicts the path of a bit read from the memory while a bit is being loaded into the cache latch for being written in another page of the memory according to the invention.

The page buffer of this embodiment may ensure that while data from page (k) are downloaded into the IO buffers of the memory device from the "main" latch, data relative to another page (k+1) may be stored into the "cache" buffer, and subsequently downloaded into the IO buffers. In other words, a "cache read" functionality is ensured with this circuit approach, as will be appreciated by a person of ordinary skill in the art from FIG. 16.

Figure 17:
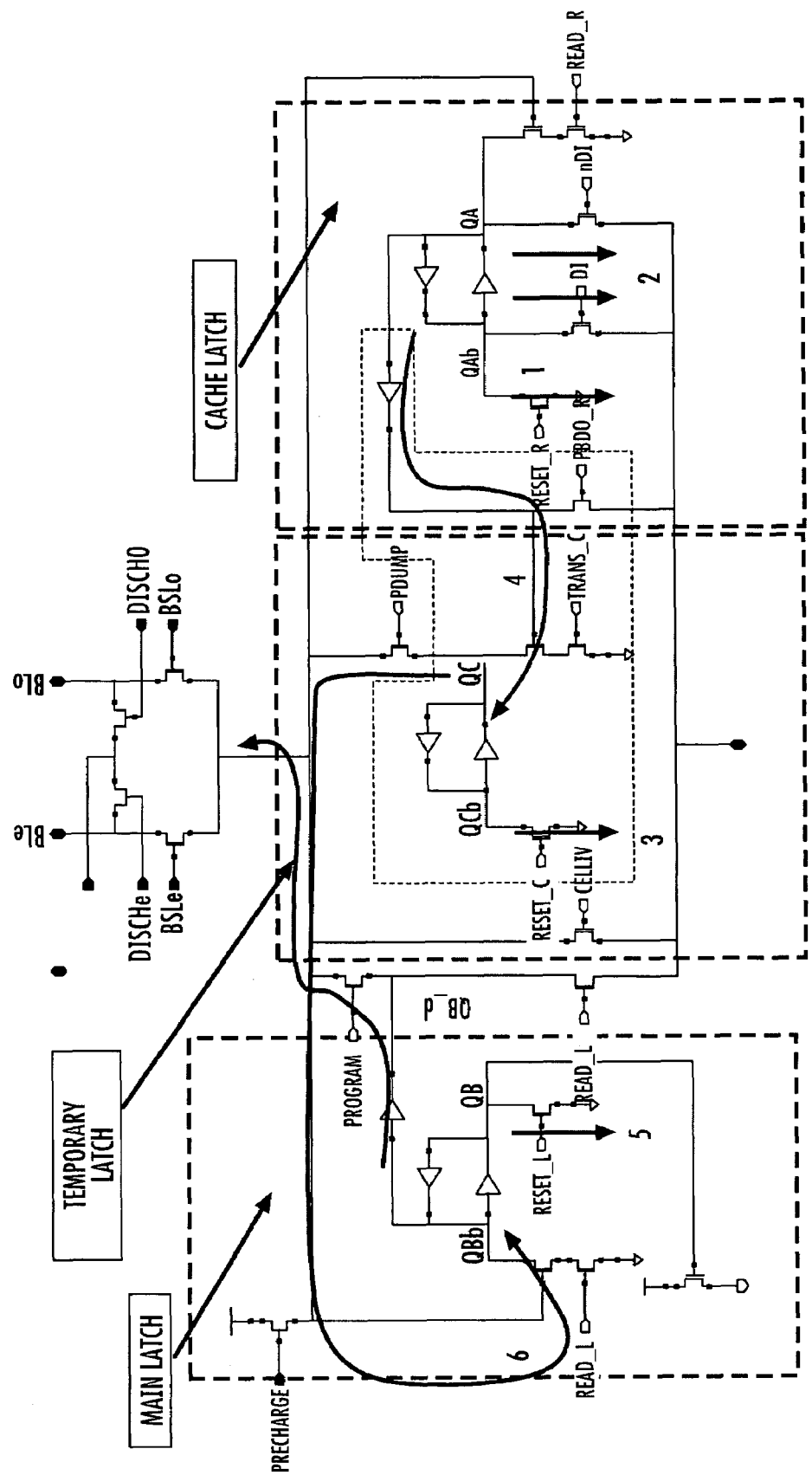
FIG. 17 illustrates the sequence of steps "pattern storage", "pattern handling", and "pattern program" in a page buffer according to the invention.

FIG. 17 illustrates the previously mentioned sequence of steps "pattern storage", "pattern handling", and "pattern program" in handling data:

Phase 1: preset the cache latch (RESET_R is pulsed);
Phase 2: uploading of the pattern from TO pads into the cache latch (through DI and nDI assertion);
  QA="1"→write "1"; QA="0"→write "0";
Phase 3: reset of temporary latch (RESET_C is pulsed);
Phase 4: data transfer from cache latch to temporary latch (through TRANS_C signal assertion);
Phase 5: reset the main latch (RESET_L is pulsed);
Phase 6: data transfer from the temporary latch into the main latch (through PDUMP and READ_L pulsing);
Phase 7: pattern programming by forcing bitline voltage according to a QB_d logic state (Vdd=program inhibit, 0=program 0 information) when PROGRAM is asserted.

Figure 18:
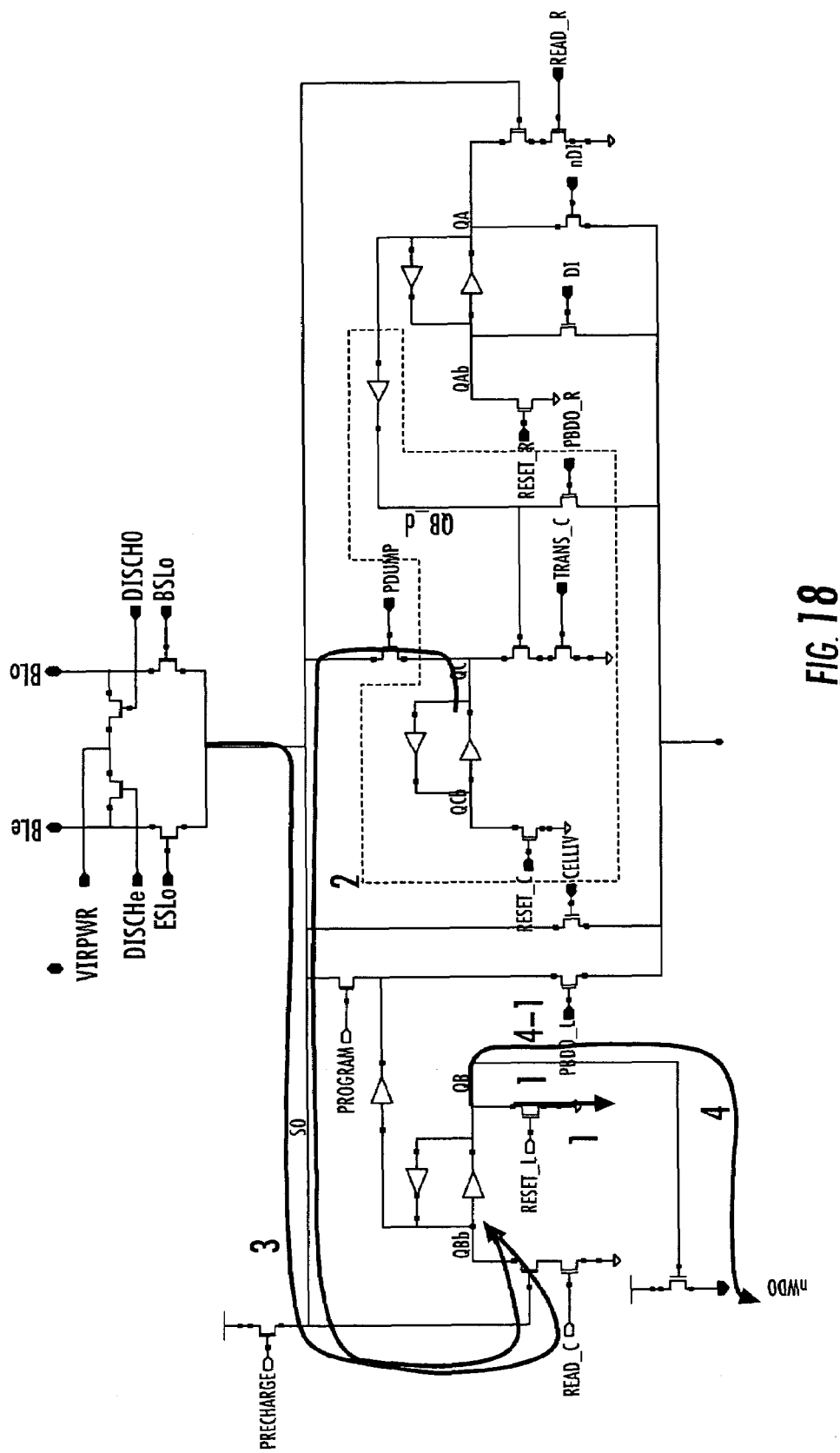
FIG. 18 illustrates the program-verify operation in the page buffer according to the invention.

FIG. 18 illustrates the previously mentioned program-verify operation in the page buffer:
Phase 1: reset the main latch (through RESET_L);
Phase 2: refresh of information from the temporary latch into the main latch (through PDUMP and READ_L pulsing);
Phase 3: bitline sensing through SO node, and update the main latch (through READ_L pulsing);
Phase 4: global program-verify flag checking through nWDO.

Figure 19:
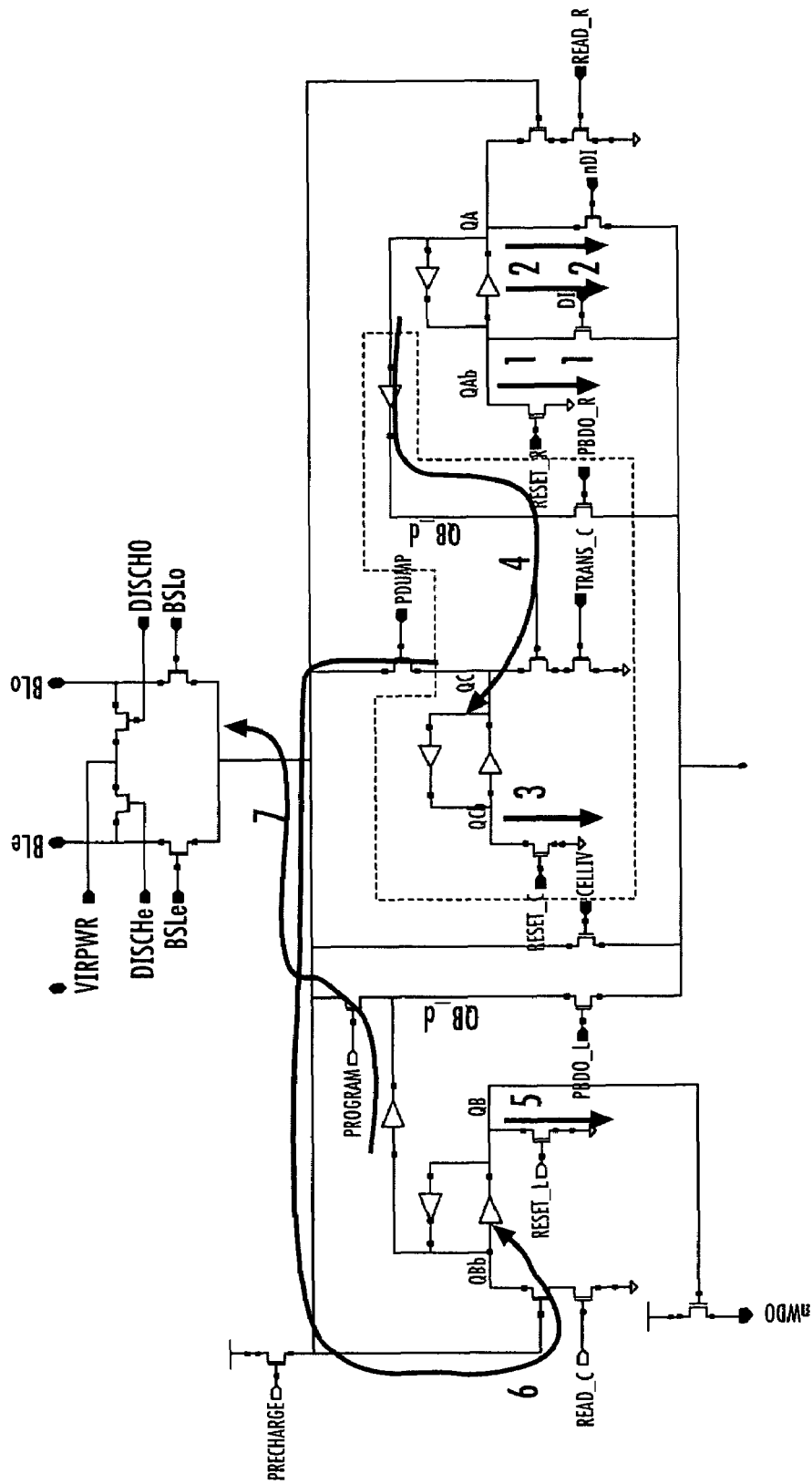
FIG. 19 illustrates the "cache program" step in the page buffer according to the invention.
Figure 20:
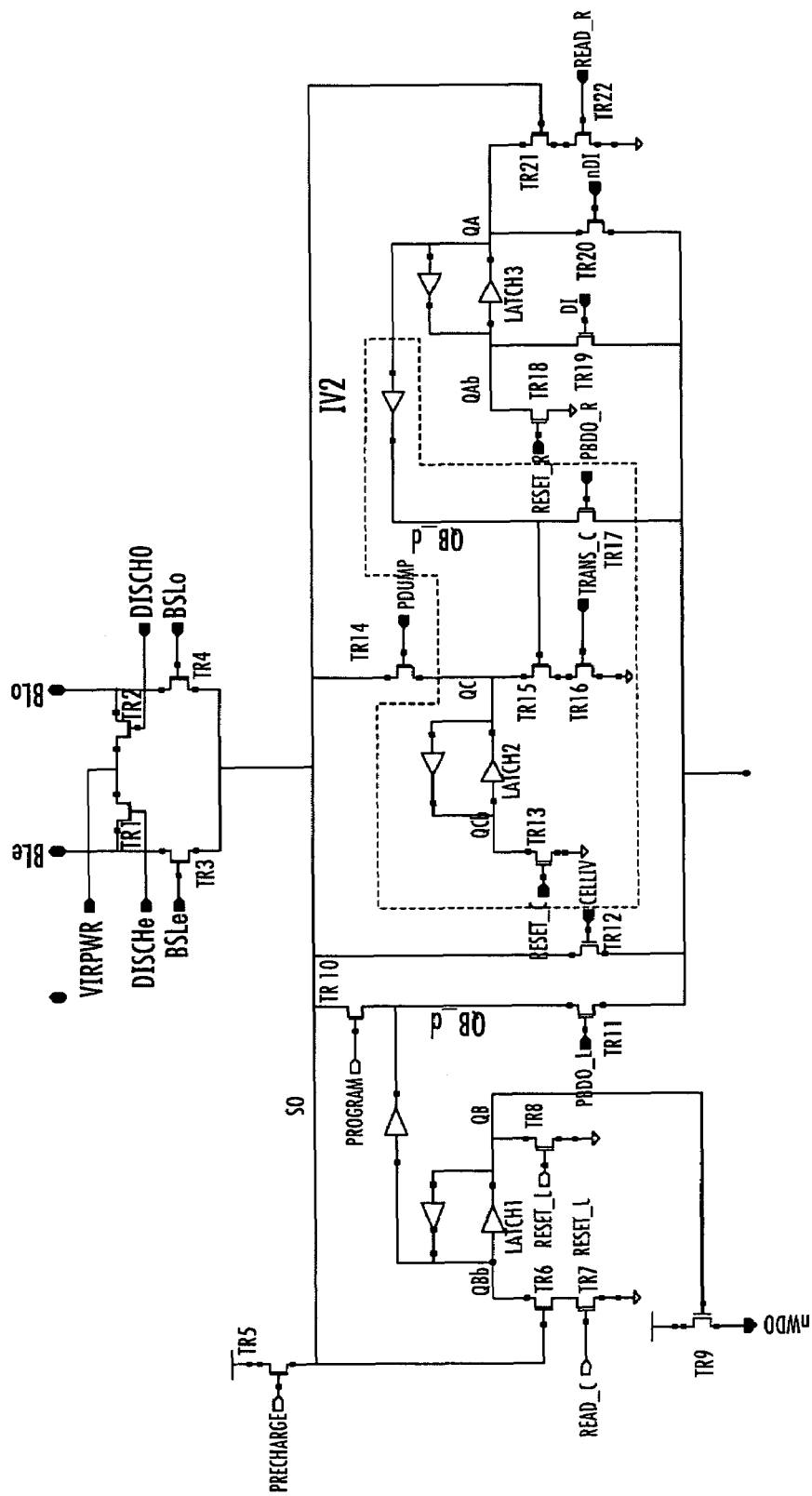
FIG. 20 depicts the page buffer according to the invention and the main signals involved in program operations, program-verify operations and read operations.
Figure 22:
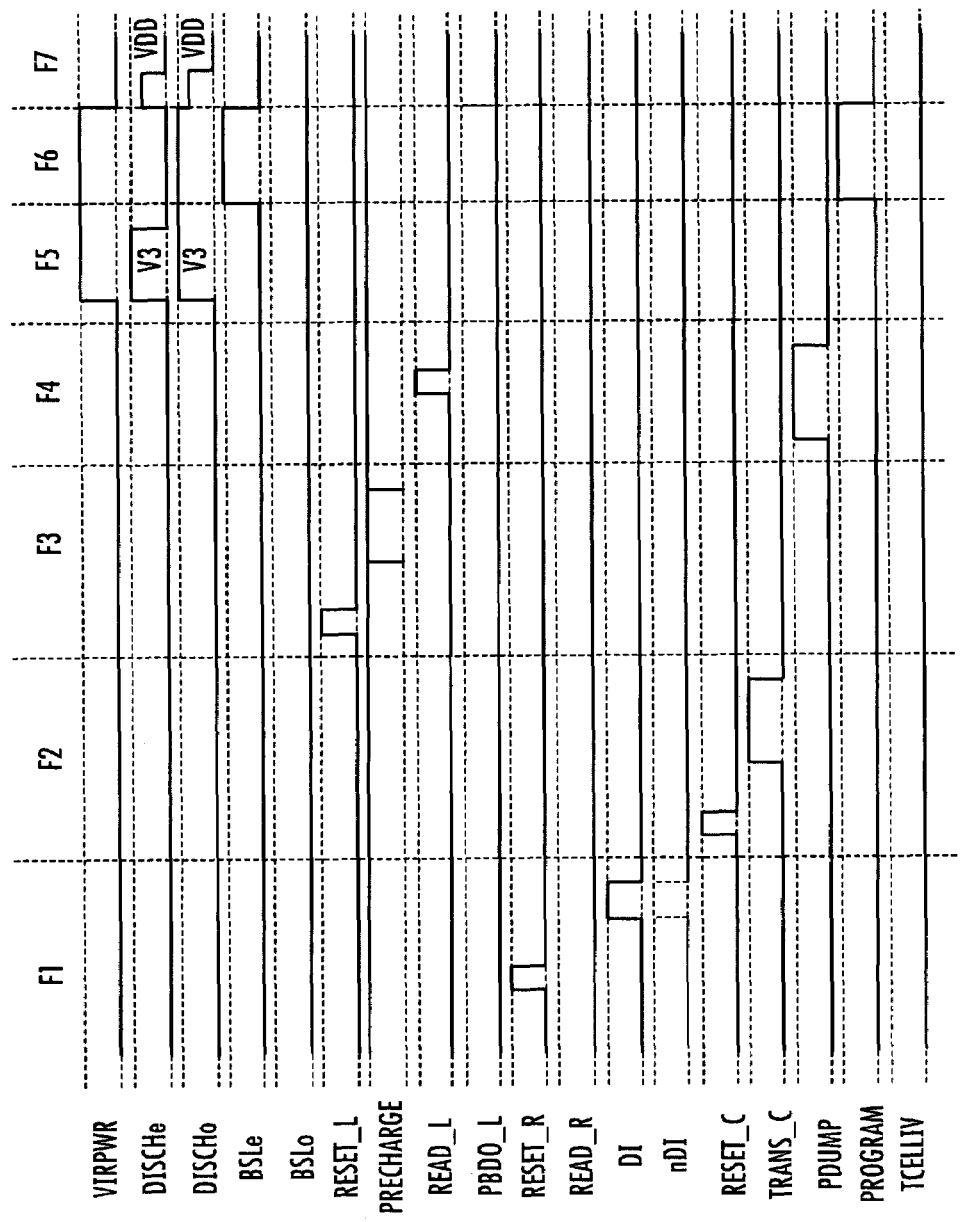
FIG. 22 is a sample time graph of the main signals of the page buffer according to the invention during a program operation.
Figure 23:
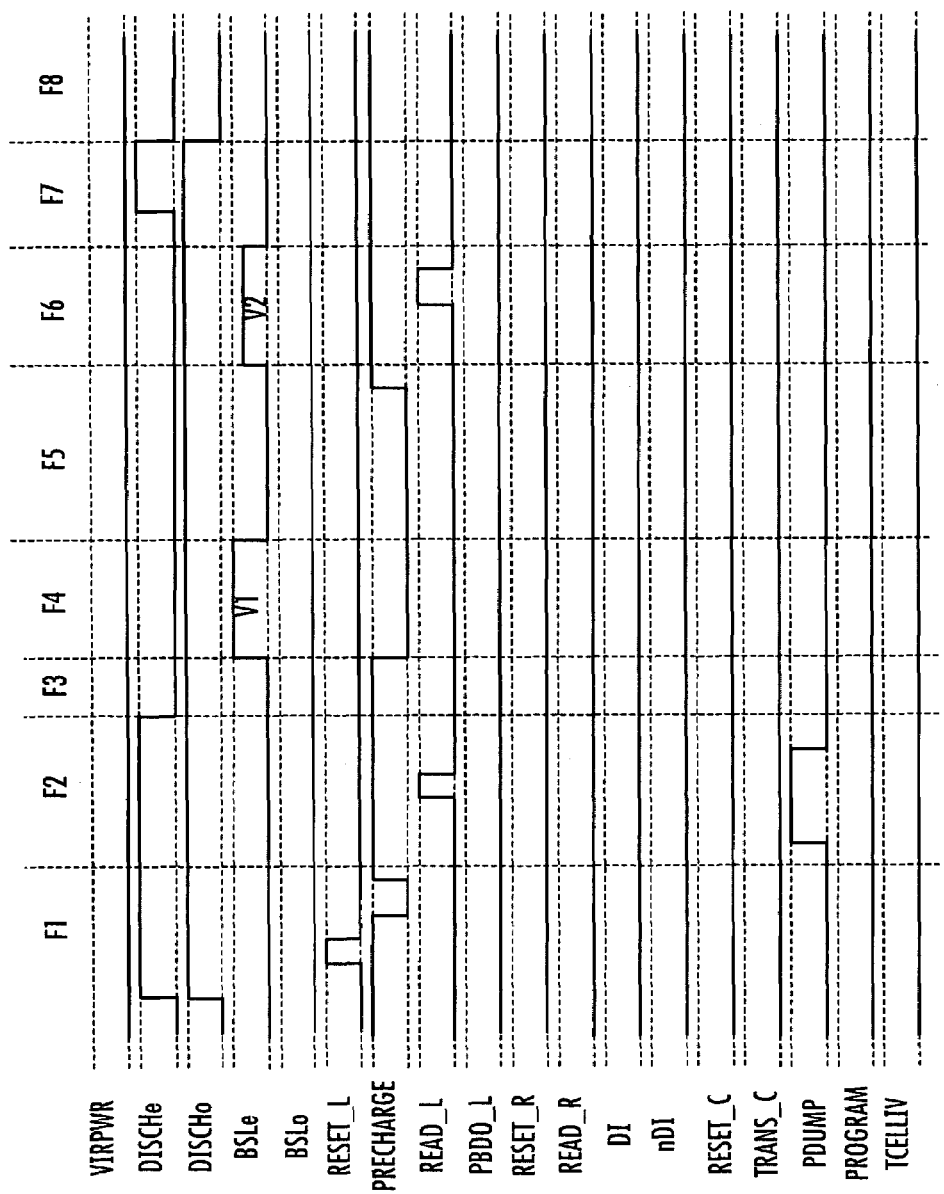
FIG. 23 is a sample time graph of the main signals of the page buffer according to the invention during a program-verify operation.

The previously mentioned "cache program" step is illustrated in FIG. 19. The sequence "1 . . . 7" is the same as the one previously described sequence for program. After data is transferred from the "cache" page buffer to the "temporary" page buffer (phase 4), the "cache" page buffer can be used to upload data from the next page, thus a "cache program" is ensured. Sample time graphs of the main signals of this page buffer, depicted in FIG. 20, are shown in FIGS. 21 to 23 for a read operation, a program operation, and a program-verify operation, respectively.

Figure 21:
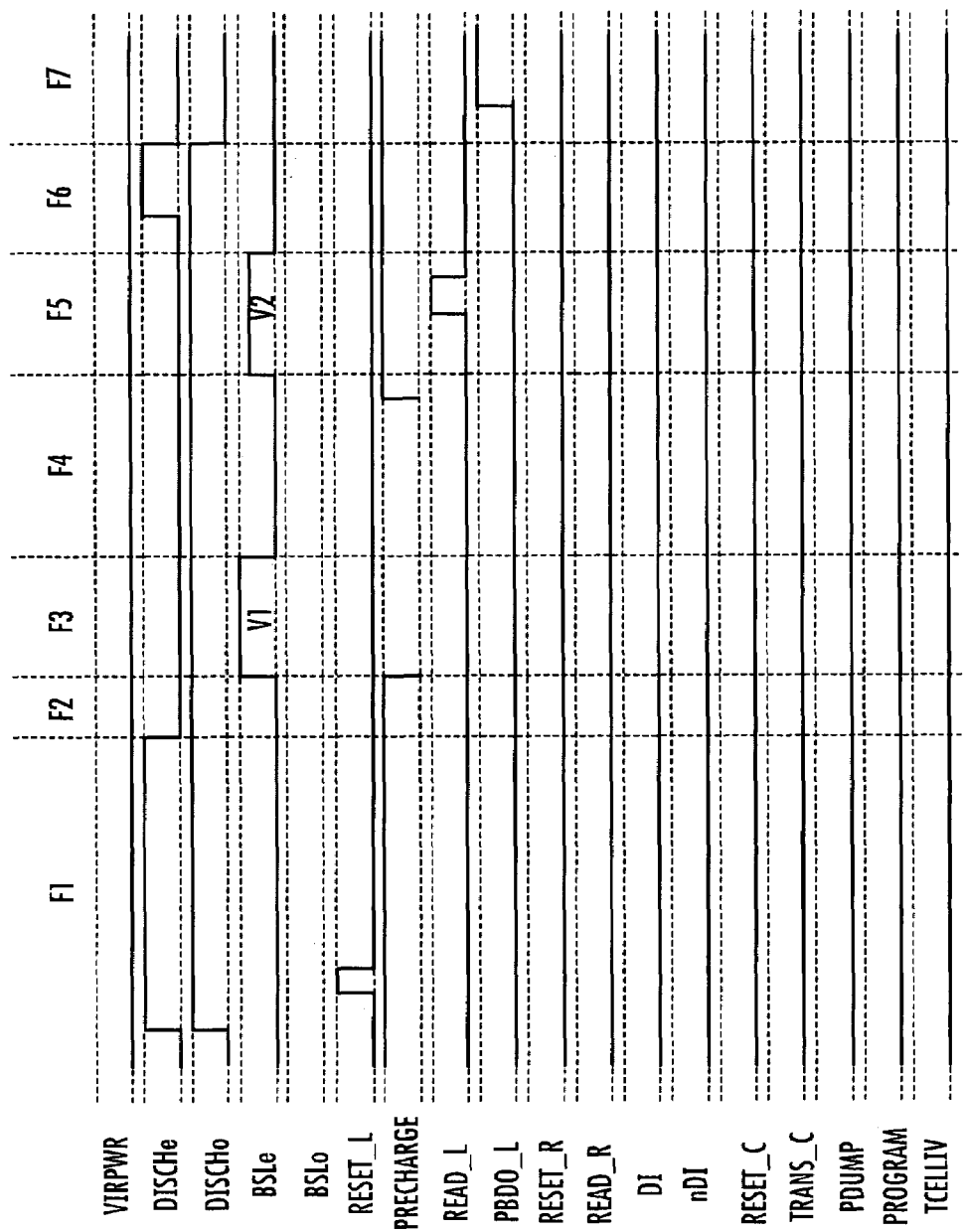
FIG. 21 is a sample time graph of the main signals of the page buffer according to the invention during a read operation.

For example, let us suppose that the read program and program-verify operations are carried out on an even bit line, and let us refer to the time graph of FIG. 21:

Step F1: the bit line pair (BLe, BLo) attached to page buffer is discharged to "0" (GND) through NMOS transistors TR1, TR2 respectively while the signals DTSCHe, DISCHo are "1" (that is at the supply voltage VDD). VIRPWR signal is kept equal to "0" for the whole step F1. The node QB of the LATCH1 is latched to "0" through the NMOS transistor TRS by a positive pulse RESET_L signal.

Step F2: the DISCHe signal is set to "0" and NMOS transistor TR1 is off, while DISCHo signal is kept equal to "1" in order to keep BLo=0.

Step F3: the BSLe signal is set to "V1" voltage level, thus BLe and SO are connected through NMOS transistor TRS in order to precharge the bit line BLe to V1-Vth, being Vth the threshold voltage of the NMOS transistor TR3. During this step, the PRECHARGE signal is kept equal to "0". As long as PRECHARGE signal is "0", the node SO is at a voltage corresponding to the level "1" through the PMOS transistor TR5.

Step F4: the BSLe signal is set to "0", thus the signals BLe and SO are disconnected and the evaluation of the bit stored in the cell takes place. During PRECHARGE signal is "0" the node SO is not floating, but it is at a voltage corresponding to the level "1". After some period used to evaluate the cell, PRECHARGE signal changes its state from "0" to "1" to turn off PMOS transistor TR5. If the read cell is a programmed cell, the charge stored in its floating gate is such to keep the cell off during STEP F4 thus BLe remains at the voltage level V1-Vth determined in step F3. In case the read cell is an erased cell, there is no charge trapped in its floating gate; as a consequence the cell is turned on during step F4, thus BLe is discharged to a level below the voltage level V1-Vth in step F3.

Step F5: the BSLe signal is set to the voltage V2, thus BLe and SO are connected through NMOS transistor TR3. For programmed cell, SO voltage level remains high for a time interval long enough to turn on NMOS transistor TR6. For erased cell, the voltage SO switches from the precharged level "1" to a voltage level for a time sufficient to turn off the NMOS transistor TR6. After the voltage on the node SO is set at the respective level according to cell state, READ_L signal is positively pulsed. At this moment for programmed cell, the node QB switches from "0" to "1" due to on state of the NMOS transistor TR6. For the erased cell, the node QB is "0" because of the off state of NMOS transistor TR6.

Step F6: the BSLe signal is set to "0", thus BLe and SO are disconnected. The DISCHe signal switches from "0" to "1" to discharge BLe to "0" through the NMOS transistor TR1.

Step F7: both the DISCHe and DISCHo signals are set to "0" and the NMOS transistors TR1, TR2 are turned off respectively. After that, the PBDO_L signal switches from "0" to "1" in order to download data QB latched at the LATCH1 to the YA signal line through the inverter IV1 and the NMOS transistor TR11.

FIG. 22 is a time graph that illustrates the program operation managed by the page buffer:

Step F1: a bit is loaded into LATCH3. First, the node QA of the LATCH3 is latched to "1" through the NMOS transistor TR18 by positive pulsing the RESET_R signal. Then to store a bit equal to "1" (program inhibit), the DI pulse is activated, while for a bit "0" (program) the nDI pulse is activated. During DI or nDI pulsing, the YA node is maintained to "0". Thus the node QA remains "1" when DI is pulsed, while QA changes to "0" when nDI is pulsed.

Step F2: the bit stored in the LATCH is transferred to the LATCH2. First, the node QC at the LATCH2 is latched to "1" through the NMOS transistor TR13 by positive pulsing the RESET_C signal. Then the TRANS_C signal is pulsed to turn on the NMOS transistor TR16. If QA is "1", QAb_d is "0" thus the NMOS transistor TR15 is off during TRANS_C pulsing. The node QC remains "1". If QA is "0", QAb_d is "1" thus the NMOS transistor TR15 is on during TRANS_C pulsing. The node QC switches to "0".

Step F3: the node QB at the LATCH1 is latched to "0" through the NMOS transistor TR8 by positive pulsing RESET_L signal. Then the PRECHARGE signal is "1" in order to precharge the node SO to "1".

Step F4: the data in the LATCH2 are transferred to the LATCH1. The signal PDUMP is "1" to turn on the NMOS transistor TR14 and the READ_L signal is pulsed during PDUMP is "1". If QC is "1", the NMOS transistor TR6 is on during READ_L pulsing. The node QB changes to be "1" (program inhibit condition). If QC is "0", the NMOS transistor TR6 is off during READ_L pulsing. The node QB remains to be "0" (program condition).

Step F5: the bit line pair (BLe, BLo) is precharged before the program pulse is activated. The signal VIRPWR changes from "0" to "1". The signal DISCHe is at the voltage "V3", V3=VDD+threshold voltage of NMOS transistor TR3, in order to precharge BLe to "1" state (full VDD level). While the DISCHo signal is changed to the "V3" state and is maintained to the "V3" state.

Step F6: the program pulses are enabled. The VIRPWR signal is "1". The DISCHe signal is "0", and the DISCHo signal is at "V3" state. The BSLe signal is set to "1" to connect BLe and SO by turning on the NMOS transistor TR3. The PROGRAM signal is set to "1" to connect SO and the node QB_d by turning on the NMOS transistor TR10. QB data latched at the LATCH1 are forced to BLe through the inverter EV1, the NMOS transistor TR10, and the NMOS transistor TR3. If BLe is "1", this is a program inhibit condition. If BLe is "0", this is program condition. On the other hand, as DISCHo is set at the level V3(>Vdd), the line BLo is kept at the voltage Vdd, thus the cells of the Odd bitlines are inhibited from being programmed.

Step 7: the VIRPWR signal is set to "0" to discharge the bit line. Both DISCHe and DISCHo are "1" to turn on the NMOS transistors TR1 and TR2, respectively. The BSLe signal is set to "0" to disconnect BLe and SO by turning off the NMOS transistor TR3. The signal PROGRAM is set to "0" to disconnect SO and QB_d by turning off the NMOS transistor TR10.

FIG. 23 is a time graph that illustrates the program-verify operation managed by this page buffer:

Step F1: the bit line pair (BLe, BLo) connected to page buffer is discharged to "0" (GND) through NMOS transistors TR1, TR2, respectively, while the DISCHe, DISCHo signals are "1" (VDD). VIRPWR signal is "1" for all the steps. The node QB of the LATCH1 is reset to "0" through the NMOS transistor TR8 by positive pulsing RESET_L signal. The original data in LATCH1 are reset to "0". The original data are the latched data in LATCH1 in the previous program operation. Then the signal PRECHARGE has a "0" voltage period in order to precharge the node SO to "1".

Step F2: the latched data in previous program operation in LATCH2 is restored to the LATCH1. The signal PDUMP has a "1" voltage period to turn on the NMOS transistor TR14 and READ_L signal is pulsed while PDUMP is "1". If QC is "1", NMOS transistor TR6 is on during READ_L pulsing. The node QB switches to "1" (program inhibit condition). If QC is "0", the NMOS transistor TR6 is off during READ_L pulsing. The node QB remains to be "0" (program condition). It can be noted that, during the program-verify operation, information is loaded from LATCH2 to LATCH1. This gives the previously marginally programmed cell, which turns out to be program-failed cell, a chance to be programmed again.

Step F3: the signal DISCHe is set to "0" and the NMOS transistor TR1 is off, while the DISCHo signal is kept "1" in order to keep BLo "0".

Step F4: the signal BSLe is set to "V1" voltage level, thus BLe and SO are connected through NMOS transistor TR3 in order to precharge the bit line BLe to V1-Vth (threshold voltage of NMOS transistor TR3). During this step the signal PRECHARGE is maintained to be "0". As long as the signal PRECHARGE is "0", the node SO remains "1" through the PMOS transistor TR5.

Step F5: the signal BSLe is set to "0" thus BLe and SO are disconnected and the evaluation of cell happens. While the signal P RECHARGE is "0", the node SO is not floating but "1". After some period used to evaluate cell, the signal PRECHARGE switches from "0" to "1" to turn off the PMOS transistor TR5. If the read cell is a programmed cell, the charge stored in its floating gate is such to keep the cell off during step F4, thus BLe remains to be precharged at the voltage level V1-Vth during step F4. For erased or program-failed cell in previous program pulse, the cell is turned on during step F5 thus BLe is discharged to some level below the precharged voltage level in step F4.

Step F6: the signal BSLe is set to "V2" voltage level, thus BLe and SO are connected through NMOS transistor TR3. For programmed cell, the voltage level SO remains high for a time interval long enough to turn on the NMOS transistor TR6. For erased or program-failed cell, the voltage level SO switches from the precharged voltage level "1" to a level suitable to turn off the NMOS transistor TR6. After the voltage SO reaches the above level according to cell state, READ_L signal is positively pulsed. At this moment for programmed cell, the node QB switches from "0" to "1" due to the on state of the NMOS transistor TR6. For erased or program-failed cell, the node QB is maintained to be dumped value from the LATCH2 due to the off state of the NMOS transistor TRG.

Step F7: the signal BSLe is set to "0", thus BLe and SO are disconnected. The signal DISCHe switches from "0" to "1" to discharge BLe to "0" through the NMOS transistor TR1.

Step F8: both the signals DISCHe and DISCHo are set to "0" and the NMOS transistors TR1, TR2 are turned off, respectively. After that, the PASS flag is generated using the nWDO signals according to the state of the node QB in the LATCH1. If QB is "1", this means that the cell may be programmed or inhibited, the NMOS transistor TR9 is off. The signal nWDO is floating, thus the program operation has been executed successfully. If QB is "0", that means that the program operation has failed or is still in progress, the NMOS transistor TR9 is on. The signal nWDO is forced to "1", thus the program operation has failed.

The main features of this page buffer are that each part of the page buffer may host a static latch to ensure noise immunity during data handling. There may be a direct connection between "cache" and "temporary" latches, and between "temporary" and "main" latches. On the other hand, there may be no direct connection between cache and main page buffer. So when program-verify and cache uploading operations are in progress at the same time, better noise immunity is ensured.

Other advantages of this page buffer may be that: once data transfer is accomplished between the cache latch and the temporary latch, the cache latch is left to handle data uploading of page (i+1): in other words "cache program" function is maintained; and before each program-verify operation, the main latch is reset and its content is refreshed by transferring data from "temporary" latch, thus preventing the risk of marginal programming due to a "permanent inhibit" condition. The approach provided may accomplish this improvement with the same silicon area occupation of the prior art approach disclosed in U.S. patent application publication No. 2003/0117856 to Lee et al., because it employs the same number of transistors. This page buffer may be embodied in any nonvolatile memory in which memory cells are programmed by supplying program pulses for increasing their threshold voltage.

The invention claimed is:

1. A nonvolatile memory device comprising:
an array of memory cells to store data;
a sense node; and
a page buffer coupled to said sense node and comprising
a main latch to store data to be written into said array of memory cells,
a cache latch to store data supplied on an input line of the nonvolatile memory device and to be transferred to said main latch,
an auxiliary switch,
a source line, and
a temporary latch coupled to said main latch through said source line and to said cache latch through said auxiliary switch, the temporary latch to transfer data between said main latch and said cache latch; said cache latch to be isolated from said source line during execution of a program routine and a program-verify routine of the nonvolatile memory device and to be coupled to said source line during execution of a read routine of the nonvolatile memory device.

2. The nonvolatile memory device according to claim 1 wherein said cache latch is configurable to upload a new page of data to be stored in said array of memory cells during transfer of data from said temporary latch to said main latch.

3. The nonvolatile memory device according to claim 1 wherein said main latch is configurable to be reset by refreshing its content and re-transferring the content from said cache latch through said temporary latch before execution of the program-verify routine.

4. The nonvolatile memory device according to claim 1 wherein said array of memory cells comprises FLASH memory cells.

5. A page buffer comprising:
a main latch;
a cache latch for storing input data to be transferred to said main latch;
a source line;
an auxiliary switch; and
a temporary latch coupled to said main latch through said source line and coupled to said cache latch through said auxiliary switch for transferring data between said main latch and said cache latch; said cache latch being isolated from said source line during execution of a program- verify routine and a program- verify routine.

6. The page buffer according to claim 5 wherein said cache latch is configurable to upload a new page of data to be stored in an array of memory cells during transfer of data from said temporary latch to said main latch.

7. The page buffer according to claim 6 wherein said array of memory cells comprises FLASH memory cells.

8. The page buffer according to claim 5 wherein said main latch is configurable to be reset by refreshing its content and by re-transferring the content from said cache latch through said temporary latch before execution of the program-verify routine.

9. A method of operating a page buffer of a nonvolatile memory device having an array of memory cells to implement a program routine followed by a program-verify routine, the method comprising:
storing input data in a cache latch;
transferring data between the main latch and the cache latch through a temporary latch coupled to the main latch through a source line and coupled to the cache latch through an auxiliary switch;
isolating the cache latch from the source line during execution of the program routine and the program-verify routine; and
coupling the cache latch to the source line during execution of a read routine.

10. The method of operating a page buffer according to claim 9 further comprising configuring the cache latch to upload a new page of data to be stored in the array of memory cells during transfer of data from the temporary latch to the main latch.

11. The method of operating a page buffer according to claim 9 further comprising configuring the main latch for being reset by refreshing its content and by re-transferring the content from the cache latch through the temporary latch before execution of the program-verify routine.

12. The method of operating a page buffer according to claim 9 further comprising isolating the stored data in the cache latch from noise and voltage surges on the source line.

13. The method of operating a page buffer according to claim 9 wherein the array of memory cells comprises FLASH memory cells.

14. A method of operating a page buffer of a nonvolatile memory device comprising:
storing input data in a cache latch;
transferring data to a main latch from the cache latch through a temporary latch coupled to the main latch through a source line and coupled to the cache latch through an auxiliary switch, while isolating the cache latch from the source line during execution of a program routine and a program-verify routine; and
coupling the cache latch to the source line and transferring data to the cache latch through the source line during execution of a read routine.

15. The method of operating a page buffer according to claim 14 wherein the nonvolatile memory device comprises an array of memory cells; and further comprising configuring the cache latch to upload a new page of data to be stored in the array of memory cells during transfer of data from the temporary latch to the main latch.

16. The method of operating a page buffer according to claim 15 wherein the array of memory cells comprises FLASH memory cells.

17. The method of operating a page buffer according to claim 14 further comprising configuring the main latch for being reset by refreshing its content and by re-transferring the content from the cache latch through the temporary latch before execution of the program-verify routine.

18. The method of operating a page buffer according to claim 14 further comprising isolating the stored data in the cache latch from noise and voltage surges on the source line.

* * * * *